(12) United States Patent
Lee et al.

(10) Patent No.: US 12,225,673 B2
(45) Date of Patent: Feb. 11, 2025

(54) FOLDABLE DISPLAY APPARATUS

(71) Applicant: LG Display Co., Ltd., Seoul (KR)

(72) Inventors: Jieun Lee, Busan (KR); Changwoo Chun, Cheonan-si (KR); Nohjin Myung, Paju-si (KR); Sanghoon Oh, Jeollabuk-do (KR); Seungkyu Lee, Bucheon-si (KR); Eun Roh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 226 days.

(21) Appl. No.: 17/988,703

(22) Filed: Nov. 16, 2022

(65) Prior Publication Data

US 2023/0199983 A1 Jun. 22, 2023

(30) Foreign Application Priority Data

Dec. 22, 2021 (KR) .......................... 10-2021-0184460

(51) Int. Cl.
*H05K 5/02* (2006.01)
(52) U.S. Cl.
CPC .................................. *H05K 5/0217* (2013.01)
(58) Field of Classification Search
CPC ............................. H05K 5/0217; G06F 1/1652
See application file for complete search history.

(56) References Cited

U.S. PATENT DOCUMENTS

| 9,746,884 | B2 | 8/2017 | Lee et al. | |
| 2016/0014914 | A1* | 1/2016 | Stroetmann | G06F 1/1681 |
| | | | | 312/223.1 |
| 2016/0239051 | A1 | 8/2016 | Lee et al. | |
| 2018/0070460 | A1* | 3/2018 | Han | G06F 1/1652 |
| 2019/0258295 | A1* | 8/2019 | Fujimoto | G09F 9/00 |
| 2020/0043386 | A1* | 2/2020 | Kim | G09F 9/301 |
| 2021/0233447 | A1* | 7/2021 | Park | G06F 1/1616 |

FOREIGN PATENT DOCUMENTS

| KR | 10-2016-0100000 A | | 8/2016 |
| KR | 20170000784 A | * | 1/2017 |
| KR | 10-2017-0142597 A | | 12/2017 |

OTHER PUBLICATIONS

Lim translation of Description KR20170000784A.*

* cited by examiner

*Primary Examiner* — Jacob R Crum
(74) *Attorney, Agent, or Firm* — Fenwick & West LLP

(57) ABSTRACT

A foldable display apparatus includes a display panel having a light-emitting element disposed thereon, a cover window disposed on top of the display panel, a bottom plate disposed beneath the display panel, a bellows for supporting at least a portion of the bottom plate, a first support coupled with one end of the bellows, and an edge coupled with the other end of the bellows.

19 Claims, 11 Drawing Sheets

FOLDABLE DISPLAY APPARATUS

CROSS-REFERENCE TO RELATED APPLICATION

This application claims priority to and benefit of Korean Patent Application No. 10-2021-0184460 filed on Dec. 22, 2021, which is hereby incorporated by reference as when fully set forth herein.

BACKGROUND

Technical Field

The present disclosure relates to a display apparatus, and more particularly, to a foldable display apparatus capable of varying a size and a shape of a screen.

Description of Related Art

As we enter an information era, a display apparatus that visually expresses an electrical information signal has developed rapidly. In response thereto, various display apparatus having excellent performance, thinness, light weight, and low power consumption have been developed.

The display apparatus include a liquid crystal display apparatus (LCD), an organic light-emitting display apparatus (OLED), a quantum dot (QD) display apparatus, etc.

Recently, as demand for a large screen increases also in a portable electronic apparatus, an apparatus that realizes a display with the large screen by connecting flat panel display panels is being developed and commercialized. In particular, a foldable display apparatus using an advantage of a flexible display panel that may be bent or folded is spotlighted as a next-generation technology in a display field because of an advantage of being able to provide the display with the large screen while maintaining portability. Such foldable display apparatus may be applied to various fields such as a television, a monitor, and the like, as well as to a portable electronic apparatus such as a mobile communication terminal, an electronic notebook, an e-book, a portable multimedia player (PMP), a navigation, an ultra mobile PC (UMPC), a mobile phone, a smart phone, a tablet personal computer (PC), and the like.

Recently, a technology for forming an organic light-emitting display apparatus on a plastic substrate has been developed, making it possible to implement a foldable or flexible display apparatus with an organic light-emitting layer grafted thereon. From now on, the foldable or flexible display apparatus will be collectively referred to as a display apparatus.

In such display apparatus, a need for an ability to change a size of the display screen in response to a need of a user has gradually emerged, and research on a display apparatus that may respond to so-called mobile environment and environment of being used on an indoor desk continues.

SUMMARY

Utilizing characteristics of the display apparatus that may be bent or folded, it is suggested to propose a method in which the display panel is rolled into the foldable display apparatus in the mobile environment such that the size of the screen becomes smaller in order to maximize a feeling of grip by a hand of the user, and the display panel that has been rolled into the foldable display apparatus is unfolded in the environment of being used on the indoor desk where the feeling of grip is unnecessary to improve screen visibility. It is suggested to implement a display apparatus in which sliding is free such that an area of the so-called display screen may be easily enlarged or reduced.

The present disclosure should be able to repeat an operation in which a display panel is rolled and folded by being supported by a slidable mechanism in implementing the above-described display apparatus.

Further, a sliding operation of the display panel of the foldable display apparatus may be in a free-stop scheme in which the display panel slides to a level desired by a user and the state thereof is fixed.

When the display apparatus performs the sliding operation for enlargement and reduction of a display screen, an area of the display panel that is changed by the sliding may increase and decrease equally on left and right sides around a sliding axis, rather than in non-uniform manner on the left and right sides.

The focus of the present disclosure is to design a sliding portion such that solid durability and uniform screen display are possible while forming a variable display that is a foldable display apparatus, which is a development trend of the display apparatus, and at the same, is able to increase or decrease a size of the screen.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

A foldable display apparatus according to an embodiment of the present disclosure may include a display panel having a light-emitting element disposed thereon, a cover window disposed on top of the display panel, a bottom plate disposed beneath the display panel, a bellows for supporting at least a portion of the bottom plate, a first support coupled with one end of the bellows, and an edge coupled with the other end of the bellows.

A foldable display apparatus according to an embodiment of the present disclosure may include a bottom plate, a display panel, and a cover window sequentially disposed, and may include a bellows for supporting at least a portion of the bottom plate, a first support for supporting another portion of the bottom plate, and an edge disposed at one end of the bottom plate.

Specific details of other embodiments are included in the detailed description and the drawings.

The foldable display apparatus according to an embodiment of the present disclosure may enlarge or reduce an area of a display screen. Increase/decrease amounts of left and right sides of the screen may be constant such that an outer shape of the enlarged or reduced display screen forms a right angle of a square or rectangle.

Sliding of the screen for enlarging and reducing the area of the display screen may be implemented with a hand of a user without a separate power source.

In the sliding of the screen for enlarging and reducing the area of the display screen, the enlargement or the reduction at a user's desired level may be possible and there may be a degree of freedom in selecting the screen size as a free-stop function is included.

The foldable display apparatus according to an embodiment of the present disclosure may have an additional space for disposing main components necessary for driving the display apparatus beneath the sliding area.

Effects of the present disclosure are not limited to the above-mentioned effects, and other effects as not mentioned will be clearly understood by those skilled in the art from following descriptions.

The purposes, solutions, and effects of the disclosure as described above does not specify essential features of claims. Thus, the scope of claims is not limited by the purposes, solutions, and effects of the disclosure as described above.

DETAILED DESCRIPTIONS

Figure 1:
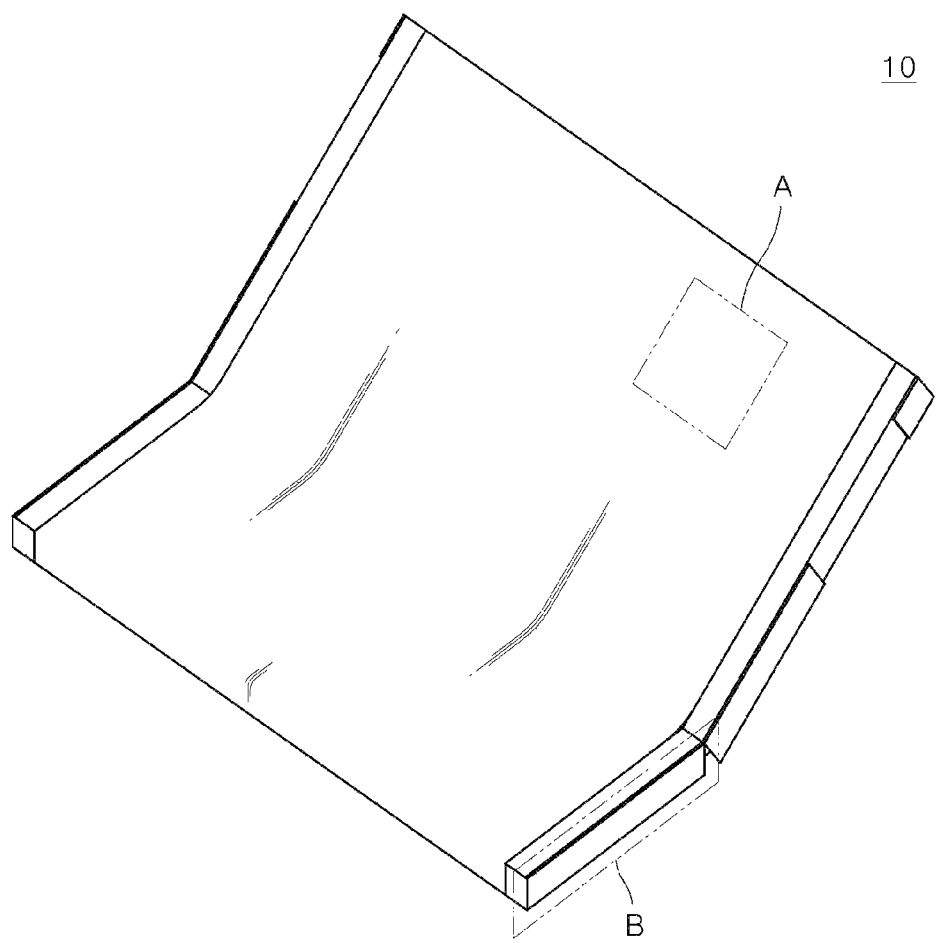
FIG. 1 is a perspective view showing a front face of a display apparatus according to an embodiment of the present disclosure.

Advantages and features of the present disclosure, and how to achieve them will become apparent with reference to the embodiments described below in detail in conjunction with the accompanying drawings. However, the present disclosure is not limited to the embodiments as disclosed below, but will be implemented in a variety of different forms. Only these embodiments make the present disclosure complete, and are constructed to fully inform those having common knowledge in the technical field to which the present disclosure belongs of a scope of the disclosure. The scope of the present disclosure is only defined by the scope of the claims.

A shape, a size, a ratio, an angle, a number, etc. disclosed in the drawings for illustrating embodiments of the present disclosure are exemplary, and the present disclosure is not limited thereto. The same reference numerals refer to the same elements herein. Further, in describing the present disclosure, when it is determined that a detailed description of a related known element may unnecessarily obscure gist of the present disclosure, the detailed description thereof will be omitted. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present. In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the apparatus in use or in operation, in addition to the orientation depicted in the figures. For example, when the apparatus in the drawings may be turned over, elements described as "below" or "beneath" or "under" other elements or features would then be oriented "above" the other elements or features. Thus, the example terms "below" and "under" may encompass both an orientation of above and below. The apparatus may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the present disclosure, a "display apparatus" may include display apparatus in a narrow sense, such as a liquid crystal module (LCM), an organic light-emitting module (OLED) module, and a quantum dot module, including a display panel and a driver for driving the display panel. Moreover, the "display apparatus" may also include a set electronic apparatus or a set apparatus such as a laptop computer, a television, and a computer monitor, an equipment display including an automotive display or displays of other types of a vehicle, a mobile electronic apparatus such as a smartphone or an electronic pad, and the like, which are complete products (or final products) including an LCM, an OLED module, a QD module, and the like.

Therefore, the display apparatus in the present disclosure may not only include the display apparatus itself in the narrow sense such as the LCM, the OLED module, the QD module, and the like, but also include the set apparatus, which is an applied product or an end-user apparatus, including the LCM, the OLED module, the QD module, and the like.

Moreover, in some cases, the LCM, the OLED module, and the QD module composed of the display panel, the driver, and the like may be expressed as the "display apparatus" in the narrow sense, and the electronic apparatus as the complete product including the LCM, the OLED module, and the QD module may be expressed as the "set apparatus". For example, the display apparatus in the narrow sense may include a liquid crystal (LCD), organic light-emitting (OLED), or quantum dot display panel, and a source PCB that is a controller for driving the display panel, and the set apparatus may be a concept that further includes a set PCB, which is a set controller that is electrically connected to the source PCB and controls the entire set apparatus.

The display panel used in the present embodiment may be any type of display panel such as a liquid crystal display panel, an organic light-emitting diode (OLED) display panel, a quantum dot (QD) display panel, an electroluminescent display panel, and the like, and may not be limited to a specific display panel capable of bezel bending with a flexible substrate for the organic light-emitting diode (OLED) display panel of the present embodiment and a lower backplate support structure. Moreover, the display panel used in the display apparatus according to an embodiment of the present disclosure is not limited in a shape or a size.

More specifically, when the display panel is the organic light-emitting diode (OLED) display panel, the display panel may include a plurality of gate lines and data lines, and pixels formed in intersection areas of the gate lines and the data lines. Moreover, the display panel may include an array including a thin-film transistor, which is an element for selectively applying a voltage to each pixel, an organic light-emitting element (OLED) layer on the array, and an encapsulation substrate or an encapsulation layer disposed on the array to cover the organic light-emitting element layer. The encapsulation layer may protect a thin-film transistor, the organic light-emitting element layer, and the like from an external impact, and may prevent penetration of moisture or oxygen into the organic light-emitting element layer. Moreover, a layer formed on the array may include an inorganic light emitting layer, for example, a nano-sized material layer or a quantum dot.

In the present disclosure, FIG. 1 shows a foldable display apparatus 10 to which an embodiment of the present disclosure is applied such that the apparatus is folded in an in-folding manner and at the same time, slides to enlarge a display area.

Referring to FIG. 1, because the display apparatus must be foldable or slidable, an organic light-emitting diode display (OLED) panel 100 may be applied as a display panel 100.

FIG. 1 illustrates the exemplary organic light-emitting diode display (OLED) panel 100 that may be integrated into the display apparatus. The organic light-emitting diode display panel 100, which is a self-luminous display element that does not require a separate light source, may be manufactured to be thin, and may be recently manufactured by manufacturing a glass substrate, which was used as a substrate for a display element, to be extremely thin or actively utilizing a plastic substrate to be actively used in a foldable display apparatus that may be folded or rolled, Referring to FIG. 1, it may be seen that, at the same time when the display apparatus 10 is folded at a certain angle around a hinge, a display area is expanded to become large in an upper portion of the hinge and the display area is reduced to become small in a lower portion of the hinge.

Figure 2:
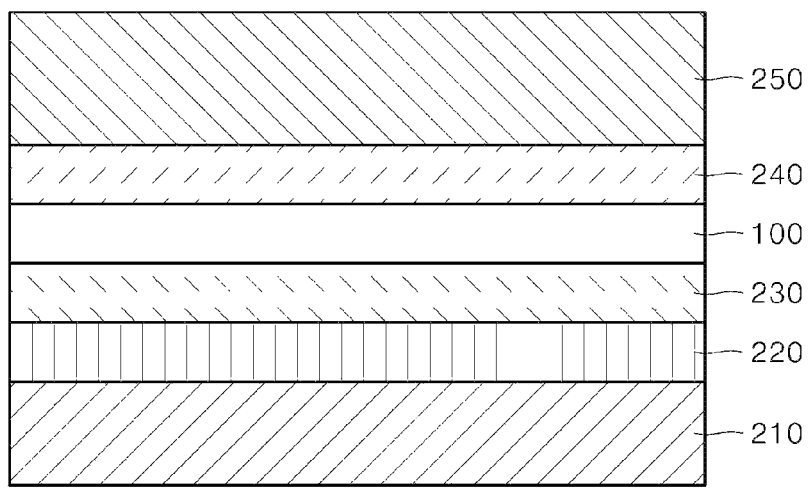
FIG. 2 is a conceptual diagram showing layers constituting a display panel according to an embodiment of the present disclosure.

FIG. 2 is a conceptual diagram showing components of the display apparatus 10 according to an embodiment of the present disclosure in an exploded manner.

Referring to FIG. 2, a bottom plate 210, a top plate 220, a back plate 230, the display panel 100, a polarizing film 240, and a cover window 250 are sequentially arranged based on a back face of the display apparatus 10.

First, the bottom plate 210 and the top plate 220 may be made of a light and transparent material such as polyethylene terephthalate (PET).

The bottom plate 210 may be disposed on the lowest layer and support the display panel 100 while in direct contact with a module of the display apparatus 10. A perforated hole (not shown) may be defined in an area of the bottom plate 210 adjacent to the hinge to facilitate a folding operation. Because the polyethylene terephthalate is a hard material with elasticity at a certain thickness, the definition of the perforated hole may be a method to maintain a constant folding performance. Hereafter, the polyethylene terephthalate will be expressed as PET.

The top plate 220 may be placed with a small thickness to be able to cover the perforated hole of the bottom plate 210. Because a step may occur in the display panel 100 located above the bottom plate 210 due to the perforated hole of the bottom plate 210, the top plate 220 may be placed to eliminate such step of the perforated hole.

The back plate 230 may be disposed on top of the top plate 220, and may be provided in a state of being attached to the display panel 100 instead of being disposed on top of the top plate 220 with a separate process. A micro-process of a micrometer (μm) unit is used for a manufacturing process of the display panel 100. As described above, the plastic substrate, for example, a polyimide (PI)-based substrate, used for the display panel 100 has flexibility, which is not suitable for the micro-process. Therefore, it is possible to support the display panel by attaching the polyethylene terephthalate that is more rigid to a bottom of the PI-based substrate.

A light-emitting element, a driving circuit for driving the same, and the like may be disposed on the display panel 100. Details will be given later.

The polarizing film 240 may be disposed on top of the display panel 100. The polarizing film 240 may be disposed to solve a malfunction of the light emitting element resulted from an inflow of external light or a decrease in visibility resulted from reflection of the external light.

The cover window 250 may be disposed on top of the polarizing film 240 to protect the display apparatus 10 from an external impact. According to an embodiment of the present disclosure, the cover window 250 may have a level of flexibility of being able to be folded and rolled via sliding. In general, a cover window 250 of a glass material may be used a lot. Recently, a continuous development of the cover window 250 is in progress to be suitable for the foldable display apparatus by allowing a thickness of the cover window 250 to be extremely small, and using the flexible glass material.

Figure 3:
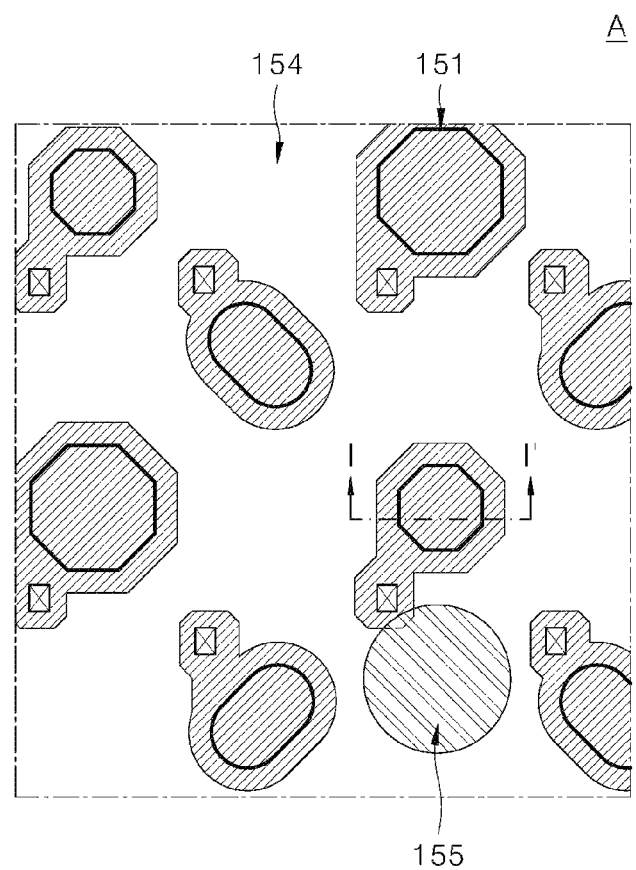
FIG. 3 is a plan view showing a display area by enlarging an area A in FIG. 1.

FIG. 3 is an enlarged view of an area A, which is a portion of a display area DA of the display panel 100 in FIG. 1, and shows a planar shape of sub-pixels arranged in the display area DA.

In FIG. 3, a number of anode electrodes 151 may be arranged in the display area DA, and a bank 154 may be filled in an area between the anode electrodes 151. The bank 154 may be disposed to cover an edge of the anode electrode 151, and may allow only a middle area of the anode electrode 151 to be in contact with an organic light-emitting stack to define a light-emitting area of the sub-pixel. A spacer 155 may be disposed in a portion of the area where the bank 154 is disposed. The spacer 155 may be disposed to have a constant density in the entire display panel 100. The spacer 155 may serve to support a mask such that the mask for deposition that covers or opens an organic layer for each sub-pixel is not directly in contact with the display panel 100 during a deposition process for forming the organic light-emitting stack. FIG. 3 exemplifies a pentile type planar structure in which the sub-pixels are arranged in a dot shape, but the present disclosure may not be limited thereto, and a real type planar structure may also be applied.

Figure 4:
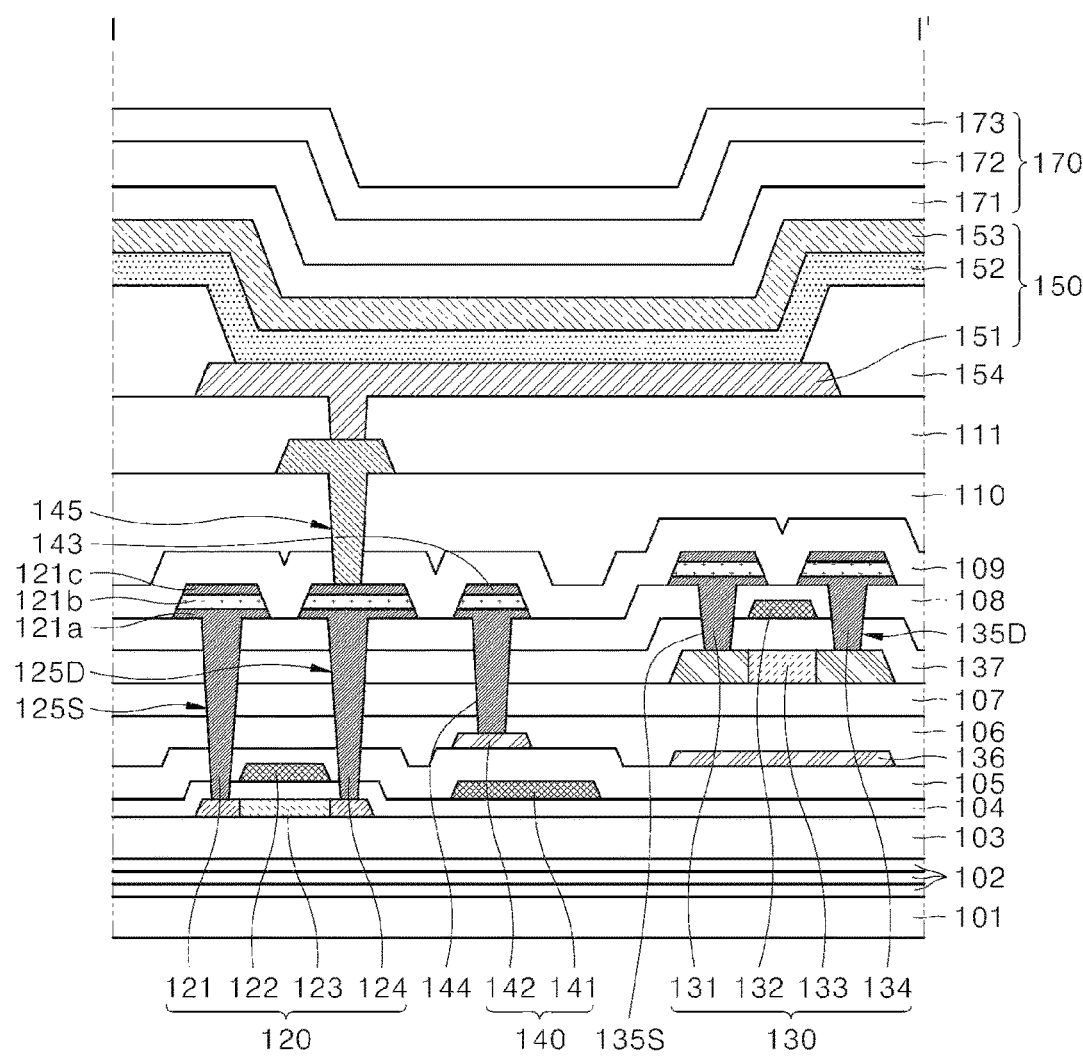
FIG. 4 is a cross-sectional view of a sub-pixel cut along a line I-I' in FIG. 2.

FIG. 4 shows a cross-sectional structure of a sub-pixel taken along a line I-I' in FIG. 3.

Referring to FIG. 4, a substrate 101, a multi buffer layer 102, and a lower buffer layer 103 may be included, and a first transistor 120 may be disposed on top of the lower buffer layer 103. A first semiconductor layer 123 constituting the first transistor 120, and a lower gate insulating film 104 for insulation from a first gate electrode 122 may be disposed on top of the first semiconductor layer 123. A first lower interlayer insulating film 105 and a second lower interlayer insulating film 106 may be sequentially disposed on top of the first gate electrode 122, and an upper buffer layer 107 may be disposed.

The multi buffer layer 102 may delay diffusion of moisture or oxygen penetrating into the substrate 101, and may be formed as a silicon nitride ($SiN_x$) and a silicon oxide ($SiO_x$) are alternately stacked at least once.

The lower buffer layer 103 may protect the first semiconductor layer 123 and may block various types of defects introduced from the substrate. The lower buffer layer 103 may be made of a-Si, the silicon nitride ($SiN_x$), or the silicon oxide ($SiO_x$).

The first semiconductor layer 123 of the first transistor 120 (e.g., a thin-film transistor) may be composed of a polycrystalline semiconductor layer, and the first semiconductor layer 123 may include a channel area, a source area, and a drain area.

The polycrystalline semiconductor layer has higher mobility than an amorphous semiconductor layer and an oxide semiconductor layer, so that energy consumption is low and reliability is excellent. With such advantage, the polycrystalline semiconductor layer may be used for a driving transistor.

The first gate electrode 122 may be disposed on top of the lower gate insulating film 104, and may be disposed to overlap the first semiconductor layer 123.

A second transistor 130 may be disposed on top of the upper buffer layer 107, and a light blocking layer 136 may be disposed below an area corresponding to the second transistor 130. Referring to FIG. 4, the light blocking layer 136 may be disposed on an area corresponding to the second transistor 130 of the first lower interlayer insulating film 105, and a second semiconductor layer 133 of the second transistor 130 may be disposed on the second lower interlayer insulating film 106 and the upper buffer layer 107 to overlap the light blocking layer 136. An upper gate insulating layer 137 for insulating the second gate electrode 132 and the second semiconductor layer 133 from each other may be disposed on the second semiconductor layer 133, and then, an upper interlayer insulating film 108 may be disposed on the second gate electrode 132. The first gate electrode 122 and the second gate electrode 132 may be composed of a single layer or multiple layers made of one of molybdenum (Mo), aluminum (Al), chromium (Cr), gold (Au), titanium (Ti), nickel (Ni), neodymium (Nd), and copper (Cu) or an alloy thereof, but the present disclosure may not be limited thereto.

The first and second lower interlayer insulating films 105 and 106 may be formed as an inorganic film having a higher hydrogen particle content than the upper interlayer insulating film 108. For example, the first and second lower interlayer insulating films 105 and 106 may be made of the silicon nitride (SiNx) formed by a deposition process using NH3 gas, and the upper interlayer insulating film 108 may be made of the silicon oxide (SiOx). Hydrogen particles contained in the first and second lower interlayer insulating films 105 and 106 may diffuse into the polycrystalline semiconductor layer during a hydrogenation process and fill pores in the polycrystalline semiconductor layer. Accordingly, the polycrystalline semiconductor layer may be stabilized to prevent deterioration of characteristics of the first transistor 120. After the activation and hydrogenation processes of the first semiconductor layer 123 of the first transistor 120, the second semiconductor layer 133 of the second transistor 130 may be formed. In this regard, the second semiconductor layer 133 may be formed of an oxide semiconductor. Because the second semiconductor layer 133 is not exposed to a high-temperature atmosphere of the activation and hydrogenation processes of the first semiconductor layer 123, damage to the second semiconductor layer 133 may be prevented and reliability may be improved. After the upper interlayer insulating film 108 is disposed, a first source contact hole 125S and a first drain contact hole 125D may be defined to respectively correspond to source and drain areas of the first transistor, and a second source contact hole 135S and a second drain contact hole 135d may be defined to respectively correspond to source and drain areas of the second transistor 130. Referring to FIG. 4, the first source contact hole 125S and the first drain contact hole 125D may be defined continuously from the upper interlayer insulating film 108 to the lower gate insulating film 104, and the second source contact hole 135S and the second drain contact hole 135D may be defined in the second transistor 130 as well. The first source electrode 121 and the first drain electrode 124 corresponding to the first transistor 120, and the second source electrode 131 and the second drain electrode 134 corresponding to the second transistor 130 may be formed at the same time. Therefore, the number of processes for forming the source and drain electrodes of each of the first transistor 120 and the second transistor 130 may be reduced.

The first source and drain electrodes 121 and 124 and the second source and drain electrodes 131 and 134 may be composed of a single layer or multiple layers made of one of the molybdenum (Mo), the aluminum (Al), the chromium (Cr), the gold (Au), the titanium (Ti), the nickel (Ni), the neodymium (Nd), and the copper (Cu) or the alloy thereof, but the present disclosure may not be limited thereto. The first source and drain electrodes 121 and 124 and the second source and drain electrodes 131 and 134 may be of a 3-layer structure. For example, the first source electrode 121 may be composed of a first layer 121a, a second layer 121b, and a third layer 121c, and other source and drain electrodes may have the same structure.

A storage capacitor 140 may be disposed between the first transistor 120 and the second transistor 130. As shown in FIG. 4, the storage capacitor 140 may be formed by overlapping a storage lower electrode 141 and a storage upper electrode 142 with the first lower interlayer insulating film 105 interposed therebetween.

The storage lower electrode 141 may be located on the lower gate insulating film 104, and may be formed on the same layer as and made of the same material as the first gate electrode 122. The storage upper electrode 142 may be electrically connected to a pixel circuit via a storage supply line 143. The storage upper electrode 142 may be formed on the same layer as and made of the same material as the light blocking layer 136. Such storage upper electrode 142 may be exposed via a storage contact hole 144 extending through the second lower interlayer insulating film 106, the upper buffer layer 107, the upper gate insulating layer 137, and the upper interlayer insulating film 108 to be connected to the storage supply line 143. The storage upper electrode 142 is spaced apart from the light blocking layer 136 as shown in FIG. 4, but is able to be integrally formed with the light blocking layer 136. The storage supply line 143 may be formed on the same plane as and made of the same material as the first source and drain electrodes 121 and 124 or the second source and drain electrodes 131 and 134. For this reason, the storage supply line 143 may be formed simultaneously with the first source and drain electrodes 121 and 124 or the second source and drain electrodes 131 and 134 through the same mask process.

As an inorganic insulating material such as SiNx or SiOx is deposited on a front face of the substrate 101 on which the first source and drain electrodes 121 and 124, the second source and drain electrodes 131 and 134, and the storage supply line 143 are formed, a protective film 109 may be formed. A first planarization layer 110 may be formed on the substrate 101 on which the protective film 109 is formed. Specifically, the first planarization layer 110 may be disposed by applying an organic insulating material such as an acrylic-based resin onto a front face of the substrate 101 on which the protective film 109 is formed.

After the protective film 109 and the first planarization layer 110 are disposed, and a contact hole exposing the first source electrode 121 or the first drain electrode 124 of the first transistor 120 may be defined through a photolithography process. A connection electrode 145 made of a material of Mo, Ti, Cu, AlNd, Al, and Cr or an alloy thereof may be disposed in a contact hole area exposing the first drain electrode 124.

A second planarization layer 111 may be disposed on the connection electrode 145 and a contact hole exposing the connection electrode 145 may be defined in the second planarization layer 111, so that the light-emitting element 150 connected to the first transistor 120 may be disposed.

The light-emitting element 150 may include an anode electrode 151 connected to the first drain electrode 124 of the first transistor 120, at least one organic light-emitting stack 152 formed on the anode electrode 151, and a cathode electrode 153 formed on the organic light-emitting stack 152.

The organic light-emitting stack 152 may include a hole injection layer, a hole transport layer, a light-emitting layer, an electron transport layer, and an electron injection layer, and a charge generating layer may be additionally disposed between light-emitting layers in a tandem structure in which a plurality of light-emitting layers are overlapped. The light-emitting layer may emit light of different colors for the sub-pixels. For example, a light-emitting layer for red, a light-emitting layer for green, and a light-emitting layer for blue may be separately formed for the respective sub-pixels. However, a common light-emitting layer may be formed to emit white light without color distinguishment for each pixel, and a color filter that distinguishes the colors may be separately disposed. Such light-emitting layer may be divided into a real RGB Type and a white OLED (WOLED). The light-emitting layers may be individually formed, but the injection layers or the transport layers may be formed as a common layer and may be equally disposed for each sub-pixel.

The anode electrode 151 may be connected to the connection electrode 145 exposed through the contact hole extending through the second planarization layer 111. The anode electrode 151 may be formed in a multi-layer structure including a transparent conductive film and an opaque conductive film having a high reflective efficiency. The transparent conductive film is made of a material having a relatively high work function value, such as an indium-tin-oxide (ITO) or an indium-zinc-oxide (IZO), and the opaque conductive film is formed in a single-layer or multi-layer structure containing Al, Ag, Cu, Pb, Mo, Ti, or an alloy thereof. For example, the anode electrode 151 may be formed in a structure in which the transparent conductive film, the opaque conductive film, and the transparent conductive film are sequentially stacked, or in a structure in which the transparent conductive film and the opaque conductive film are sequentially stacked. Such anode electrode 151 is disposed on the second planarization layer 111 so as to overlap not only the light-emitting area defined by the bank 154, but also a pixel circuit area where the first and the second transistors 120 and 130 and the storage capacitor 140 are disposed, thereby increasing a light-emitting area.

The organic light-emitting stack 152 may be formed by stacking the hole transport layer, the organic light-emitting layer, and the electron transport layer on the anode electrode 151 in order or in a reverse order. In addition, the organic light-emitting stack 152 may further include the charge generating layer, and may include first and second light-emitting stacks opposite to each other with the charge generating layer interposed therebetween.

The bank 154 may be formed to expose the anode electrode 151. Such bank 154 may be made of an organic material such as photoacryl, or may be made of a translucent material, but may be made of an opaque material to prevent light interference between the sub-pixels without being limited thereto.

The cathode electrode 153 may be formed on a top face of the organic light-emitting stack 152 to be opposite to the anode electrode 151 with the organic light-emitting stack 152 interposed therebetween. When the cathode electrode 153 is applied to a top emission type organic light-emitting display apparatus, the indium-tin-oxide (ITO), the indium-zinc-oxide (IZO), or magnesium-silver (Mg—Ag) may be thinly formed to form the transparent conductive film.

An encapsulation layer 170 for protecting the light-emitting element 150 may be formed on the cathode electrode 153. The light-emitting element 150 may react with external moisture or oxygen to cause a dark-spot or a pixel shrinkage due to a nature of the organic light-emitting stack 152, so that the encapsulation layer 170 may be disposed on the cathode electrode 153 to prevent such phenomenon. The encapsulation layer 170 may be composed of a first inorganic insulating film 171, a foreign material compensation layer 172, and a second inorganic insulating film 173.

A touch portion may be disposed at an upper portion where the encapsulation layer 170 is formed. The touch portion may include a first touch planarization layer, a touch electrode, and a second touch planarization layer. The first touch planarization layer and the second touch planarization layer may be disposed to eliminate a step at a point where the touch electrode is disposed and to be electrically well insulated.

Figure 5A:
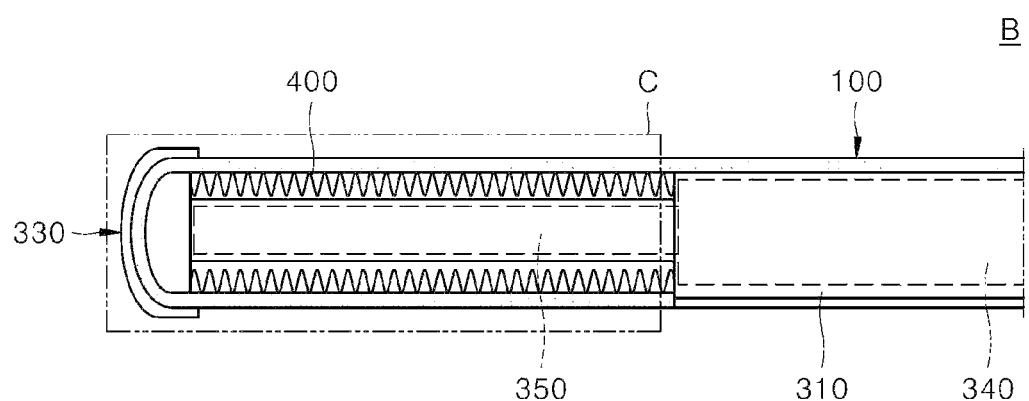
FIG. 5A is a cross-sectional view showing a sliding portion by expanding a cross-section of an area B in FIG. 1.

FIG. 5A is an enlarged cross-sectional view of an area B that slides in a foldable display apparatus in FIG. 1. Referring to FIG. 1 and FIG. 5A, a state in which the display area is reduced and the display panel 100 is rearwardly rolled into the display apparatus 10 may be identified. For convenience of description, only the display panel 100 is expressed, and the plates, the polarizing film 240, and the cover window 250 in FIG. 2 are omitted.

Referring to FIG. 5A, it may be seen that the display panel 100 extends inwardly along a corner shape of an edge 330 and has a distal end thereof on an opposite side of the display area.

Referring to FIG. 5A, it may be seen that the display panel 100 has a portion disposed on a first support 310 and the remaining portion disposed on a bellows 400. The bellows 400 is commonly known as a corrugated tube, and has a characteristic capable of being compressed or tensioned by an external force. Often, the bellows may have a property similar to that of a spring, but, in an embodiment of the present disclosure, the bellows that may be compressed or tensioned to a specific position by the external force and may maintain that state unlike the spring will be preferred. In particular, an embodiment of the present disclosure may target a bellows of an accordion type. The accordion bellows may be given elasticity by being made of a plastic nylon-based brittle material and formed in the corrugated tube shape. Because of the elasticity resulted from the shape of the bellows, the bellows may be compressed as much as desired and expanded as much as desired, and may maintain such compressed and expanded states.

Referring to FIG. 5A, it may be seen that one end of the bellows 400 is coupled to a distal end of the first support 310 and the other end is coupled to the edge 330. The bellows 400 may be disposed on each of a front face with the display area and a rear face, which is opposite to the front face, to allow the edge 330 to maintain a coupled state without being twisted or spaced apart from the display apparatus 10. Further, the bellows 400 may simultaneously implement a function to support the display panel 100 in addition to the function to expand or reduce the display area.

There may be an empty space inside the first support 310, and such space may be referred to as a first accommodation portion 340. In the first accommodation portion 340, a battery, a circuit driver, and the like, which are components necessary for the display panel 100 to be driven, may be disposed. Further, there may be an empty space between the two bellows 400 opposite to each other, and such space may be referred to as a second accommodation portion 350. The second accommodation portion 350 may also provide an additional space for disposing components necessary for the display panel 100 to be driven in connection with the first accommodation portion 340.

Figure 5B:
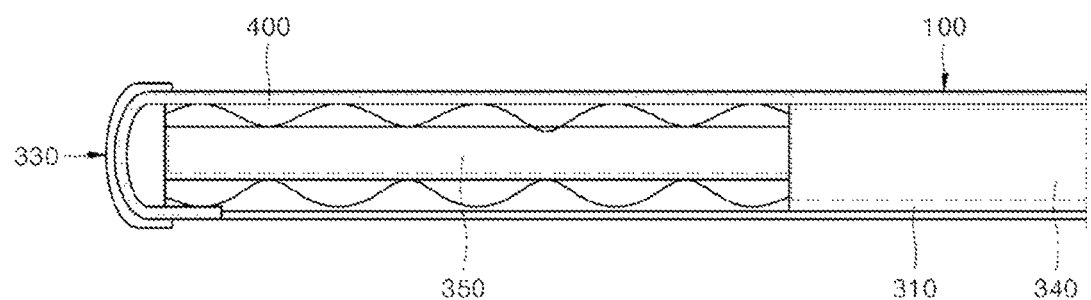
FIG. 5B is a cross-sectional view of a sliding portion according to an embodiment of the present disclosure when a display area is enlarged.

FIG. 5B is a cross-sectional view showing a state in which the display area is expanded from the state in FIG. 5A in which the display area is reduced in the display apparatus 10 according to an embodiment of the present disclosure. Referring further to FIG. 5B, it may be seen that the bellows 400 is expanded and unfolded compared to that in FIG. 5A, and the display panel 100 is disposed as far as possible to the front with respect to the edge 330, and thus, the display area is expanded.

Referring to FIG. 5B, it may be seen that the area between the two opposite bellows 400 is expanded compared to that in FIG. 5A, and thus, the second accommodation portion 350 is expanded.

Figure 6:
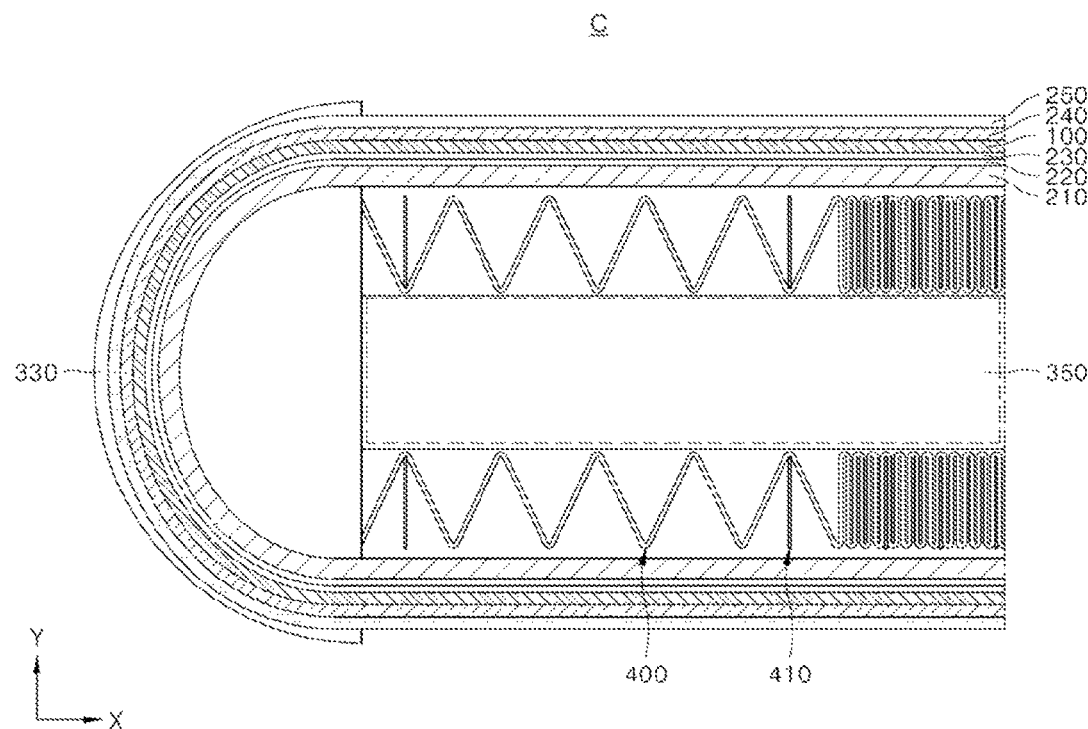
FIG. 6 is an enlarged cross-sectional view of a sliding portion according to an embodiment of in FIG. 5A.

FIG. 6 is an enlarged cross-sectional view of an area C in FIG. 5A. Referring to FIG. 6, all of the upper and lower layers of the display panel 100 omitted in FIGS. 5A and 5B are shown. There is the bottom plate 210 in direct contact with the bellows 400. The top plate 220, the back plate 230, the display panel 100, the polarizing film 240, and the cover window 250 may be sequentially disposed on the bottom plate 210. It may be seen that the above-described display panel 100 and adjacent layers thereof extend inwardly of the edge 330 along a semicircular corner of the edge 330 to a non-display area, which is on an opposite side.

The bottom plate 210 may be made of a hard PET material, so that the bottom plate 210 may be in direct contact with the bellows 400 and may protect the display panel 100 while having durability against the movement of contraction and expansion of the bellows 400. Further, the bottom plate 210 may have a great thickness and may have the perforated holes (not shown) defined throughout the bottom plate 210 such that the display panel 100 of the display apparatus 10 may be folded or rolled while enduring the contraction and expansion movement of the bellows 400.

Referring to FIG. 6, it may be identified that a bellows guide bar 410 in a form of a bar is disposed in a portion of the bellows 400. The bellows guide bar 410 may serve to guide the bellows 400 to have uniformity in an x direction when contracting and expanding to reduce and expand the display area of the display apparatus 10.

Figure 7:
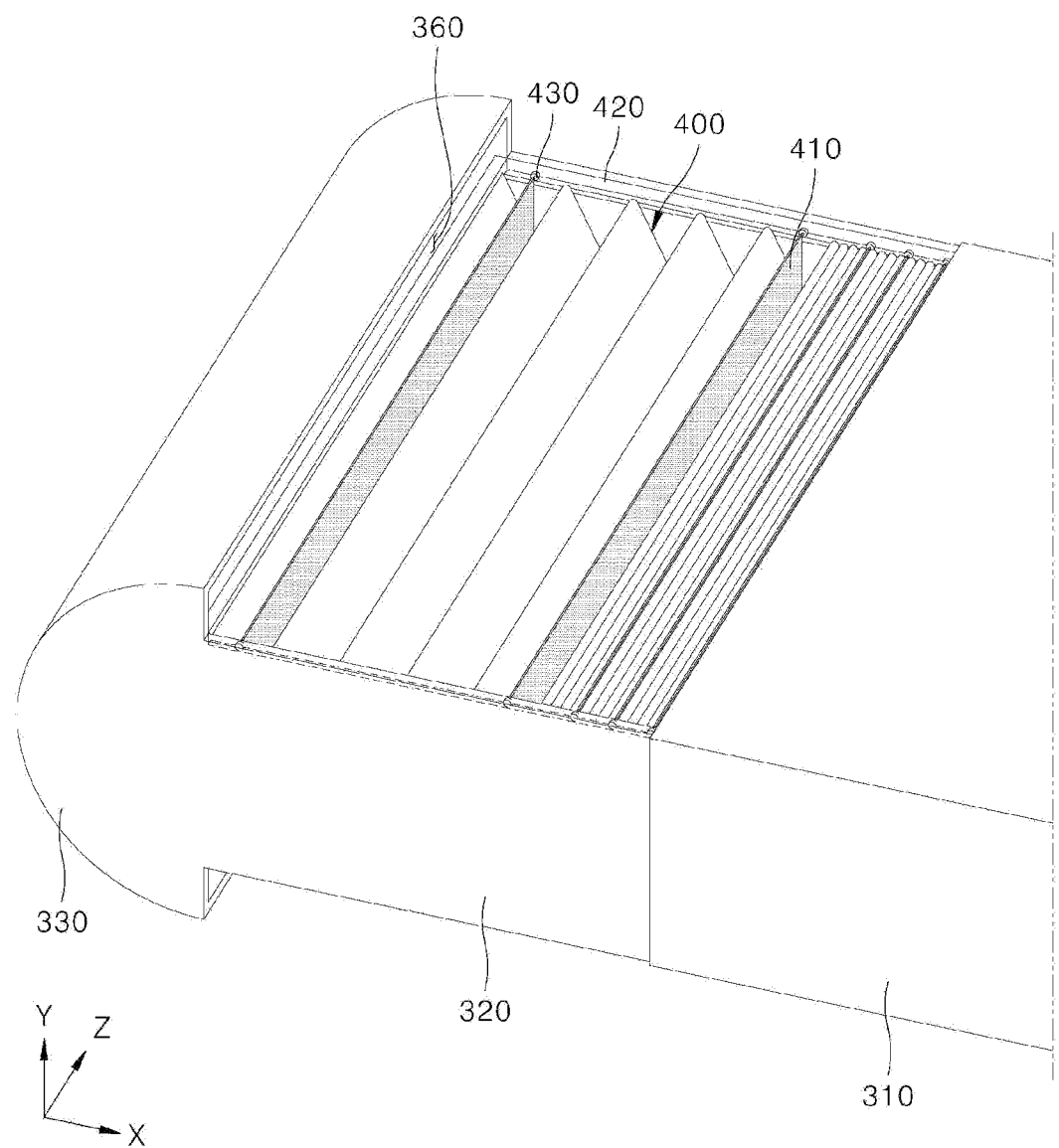
FIG. 7 is a perspective view omitting a display panel and the like to help understand a support and a bellows according to an embodiment of the present disclosure.

Referring to FIG. 7, the display panel 100 and the upper and lower layers are omitted, and the first support 310, the edge 330, the bellows 400, and the bellows guide bar 410 are arranged. It may be seen from the perspective view that a panel through-hole 360 that allows the display panel 100, the upper and lower layers thereof, and the cover window 250 to enter through a side face of the edge 330 is defined. The panel through-hole 360 is defined in upper and lower portions of the side face of the edge 330, so that, when the display area is reduced and expanded, the display panel 100 and the upper and lower layers thereof may move smoothly.

In addition, there is the second support 320 placed between the first support 310 and the edge 330, and an LM (linear motor) guide 420 may be attached to the second support 320.

A guide fastening portion 430 and the bellows guide bar 410 may be disposed on the LM guide 420. The LM guide 420 may include a linear motor, and the guide fastening portion 430 may move with respect to the LM guide 420 in response to operation of the linear motor.

Specifically, when the guide fastening portion 430 moves along a driving shaft of the LM guide 420, the bellows guide bar 410 connected to the guide fastening portion 430 may move along the driving shaft of the LM guide 420.

Referring to FIG. 7, the guide fastening portion 430 may be driven in the x-axis direction, and the LM guide 420 may be disposed parallel to the x-axis direction.

The bellows guide bar 410 may be disposed parallel to a z-axis, and the bellows guide bar 410 is uniformly disposed to guide the bellows 400 to constantly move for each zone during the contraction/expansion in the x-axis direction. Because of the characteristics of the bellows 400, a portion that is folded and unfolded during the contraction and the expansion may vary locally. Due to such phenomenon, when there is no LM guide 420, the bellows guide bar 410, and the guide fastening portion 430, there may be a difference in movement positions of the second support 320 and the edge 330 on left and right sides.

Figure 8:
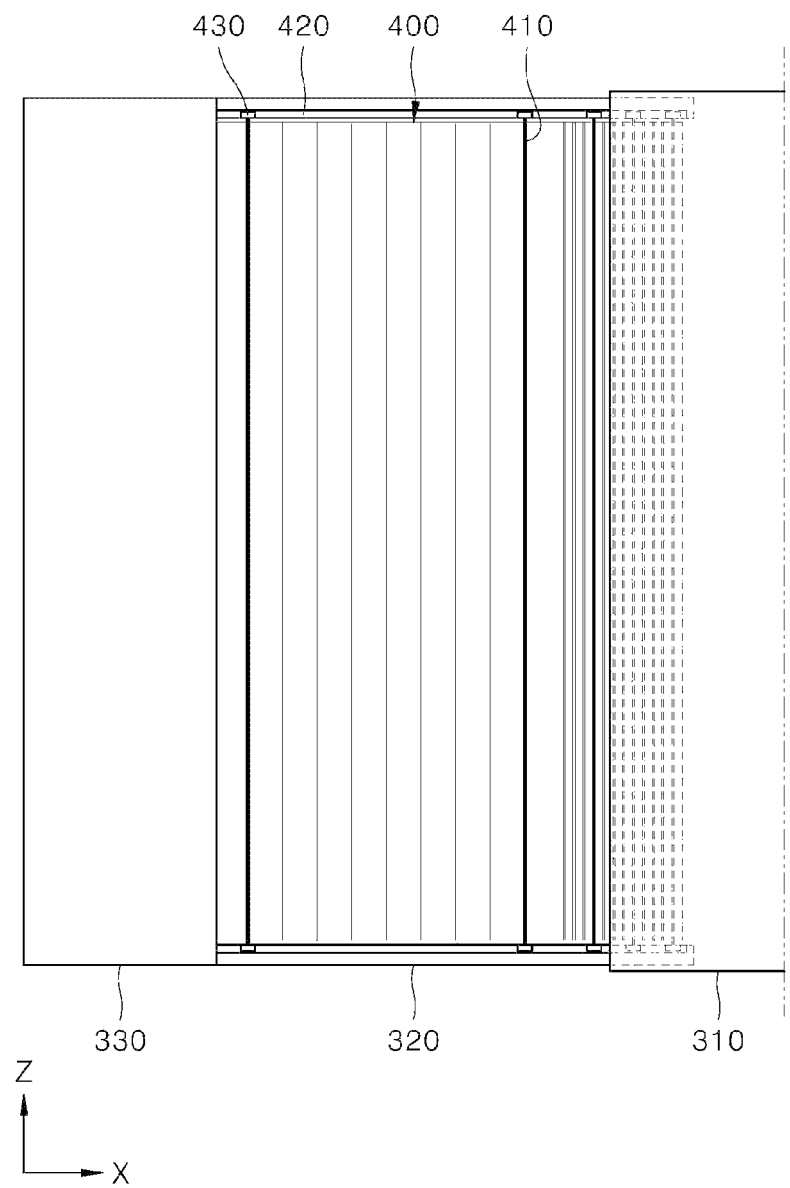
FIG. 8 is a plan view from the top of a structure in FIG. 7 according to an embodiment of the present disclosure.

FIG. 8 is a plan view showing the structure in FIG. 7 according to an embodiment of the present disclosure in a plane. Referring to FIG. 8, the components like the first support 310, the second support 320, the edge 330, and the bellows 400 from which the display panel 100 and the upper and lower layers in FIG. 7 are omitted may be seen, and it may be seen that the bellows guide bar 410 is disposed inside the bellows 400.

An outer portion of the second support 320 may be moved to be covered by the first support 310 or placed into the first support 310. As one end of the bellows 400 is fixed to the first support 310 and the other end of the bellows 400 is fixed to the edge 330, the edge 330 may repeat moving closer to and further from the first support 310.

Referring to FIG. 8, the bellows guide bar 410 may be disposed inside the bellows 400, and a portion of the bellows guide bar 410 may be disposed below the first support 310 in a situation in which the bellows 400 is not fully unfolded.

As in the description in FIG. 7, the LM guide 420 may be placed on an inner face of the second support 320, and the LM guide 420 and the guide fastening portion 430 are coupled to each other for the driving. The guide fastening portion 430 and the bellows guide bar 410 may be coupled to each other, so that the bellows guide bar 410 may be constantly driven in the x-axis direction, which is the disposition direction of the LM guide 420. When the bellows 400 expands from the contracted state, the bellows guide bar 410 disposed in the bellows 400 is pushed out together.

Figure 9A:
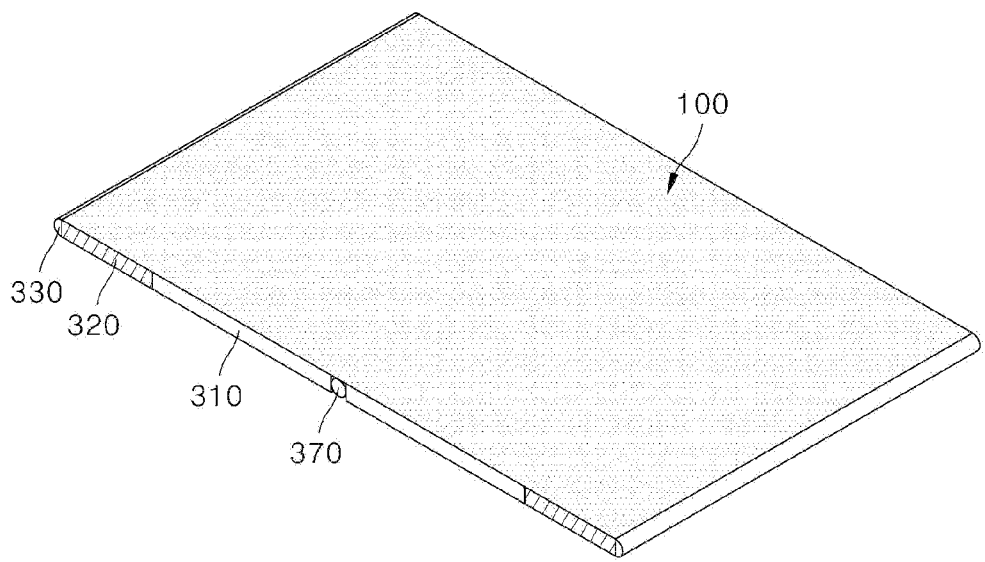
FIGS. 9A and 9B are perspective views showing a display apparatus in a reduced state as a display area slides to a side opposite to a support according to an embodiment of the present disclosure.
Figure 9B:
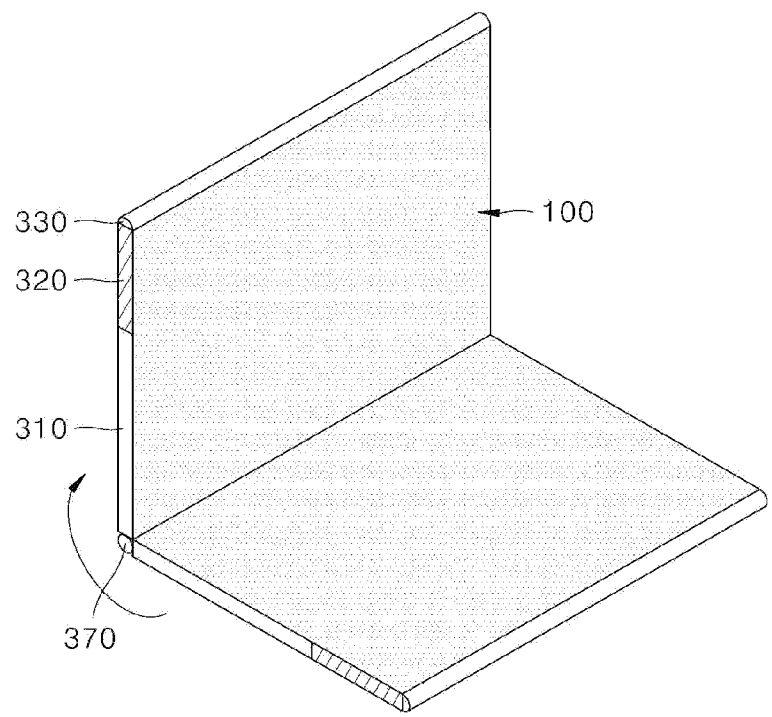

FIGS. 9A and 9B show a deformable usage scheme of the foldable display apparatus 10 according to an embodiment of the present disclosure. FIG. 9A may fold all of the bellows 400 to allow the display panel 100 to be minimally exposed to minimize the display area. FIG. 9B shows a scheme of folding the foldable display apparatus 10 in FIG. 9B according to an embodiment of the present disclosure with respect to a hinge 370 at a center at an angle of about 90 degrees. Because the foldable display apparatus 10 has a small size, such form is suitable for a mobile environment. In particular, in the case of FIG. 9B, there is an advantage in which the display apparatus is stably gripped while identifying an image of a camera installed on the back face in real time because of the folding around the hinge 370.

Figure 10A:
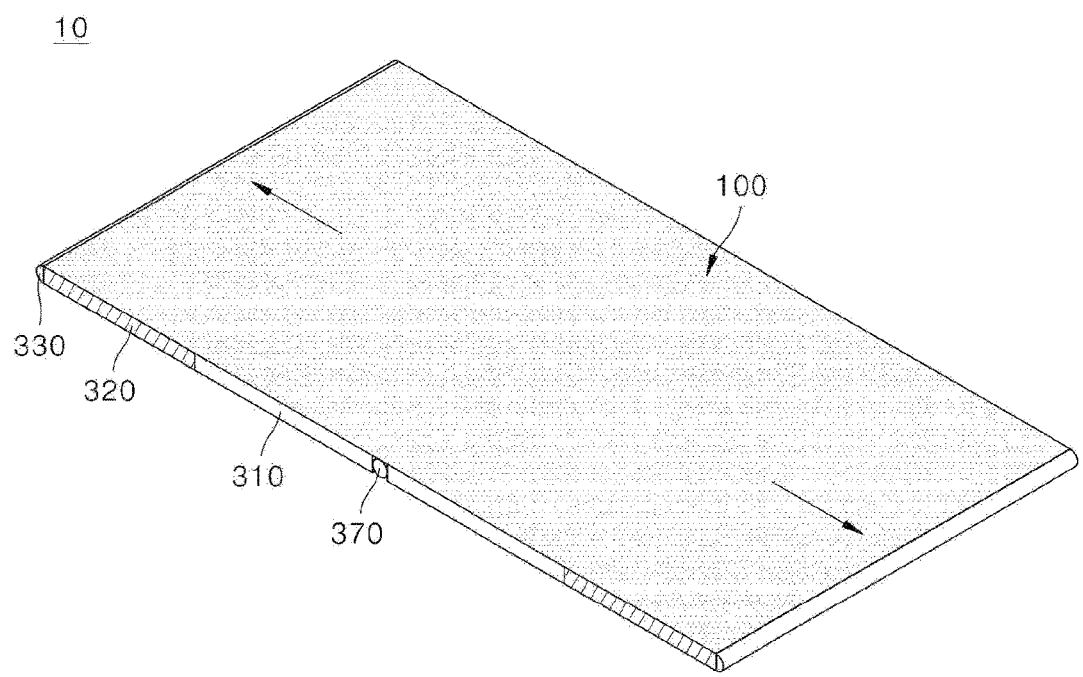
FIGS. 10A and 10B are perspective view showing a display apparatus in an enlarged state as a display area slides to a front face according to an embodiment of the present disclosure.
Figure 10B:
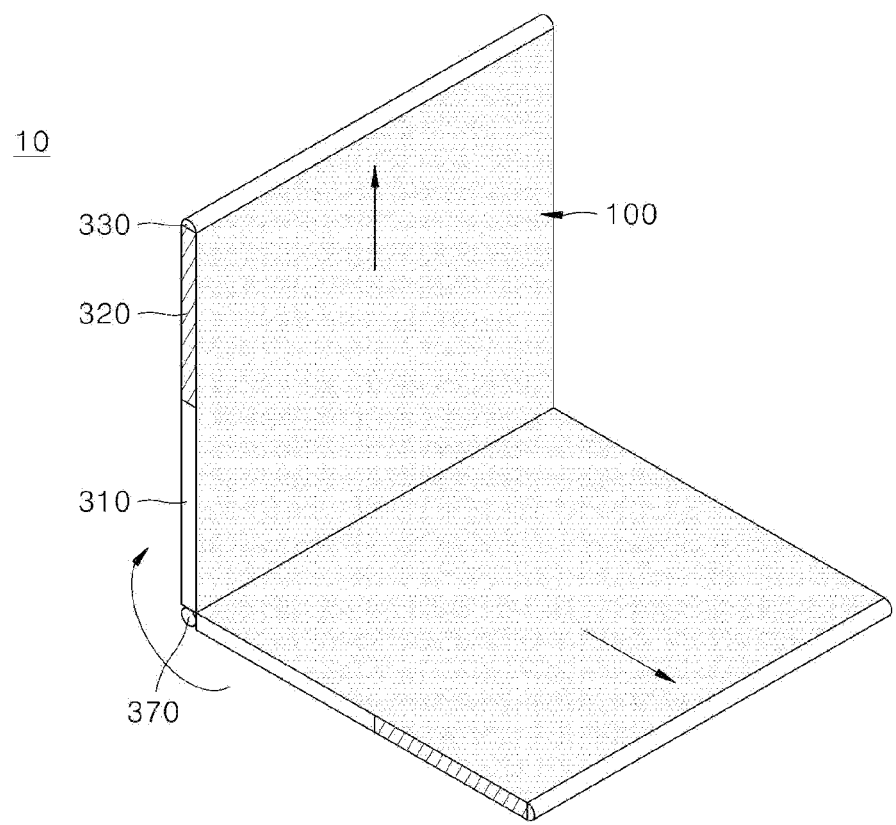

FIGS. 10A and 10B show a method of utilizing the foldable display apparatus 10 in a state in which a screen size thereof is increased by the expansion of the bellows 400. As the bellows 400 is expanded, the display panel 100 may be exposed as much as possible, which may be suitable for use with a wide screen with a desk or a mounting space rather than the mobile environment to fit the increased screen size. Referring to FIG. 10B, the foldable display apparatus 10 may be folded around the hinge 370 and may be used in a laptop form.

The display apparatus according to an embodiment of the present disclosure may have the flexibility and the spring-like elasticity at the same time when expanding and contracting with only a geometric structure by applying the accordion type bellows. Therefore, it is possible to implement a slidable display apparatus for the enlargement and the reduction of the display screen with minimal use of space without a need for a separate dynamic driver.

The display according to an embodiment of the present disclosure may include a liquid crystal display apparatus (LCD), a field emission display apparatus (FED), an organic light-emitting display apparatus (OLED), and a quantum dot display apparatus.

The display according to an embodiment of the present disclosure may also include the set electronic apparatus or the set apparatus such as the laptop computer, the television, and the computer monitor, the equipment display including the automotive display or the displays of other types of the vehicle, the mobile electronic apparatus such as the smartphone or the electronic pad, and the like, which are the complete products (or the final products) including the LCM, the OLED module, and the like.

A display apparatus according to an embodiment of the present disclosure may be described as follows.

A first aspect of the present disclosure provides a foldable display apparatus comprising: a display panel having a light-emitting element disposed thereon; a cover window disposed on top of the display panel; a bottom plate disposed beneath the display panel; a bellows for supporting at least a portion of the bottom plate; a first support coupled with one end of the bellows; and an edge coupled with the other end of the bellows.

In one implementation of the first aspect, the foldable display apparatus further includes: a second support disposed between the first support and the edge.

In one implementation of the first aspect, the foldable display apparatus further includes: an LM guide disposed inwardly of the second support; and a guide fastening portion movable with respect to the LM guide.

In one implementation of the first aspect, the foldable display apparatus further includes: a bellows guide bar disposed inside the bellows and coupled to the guide fastening portion.

In one implementation of the first aspect, the foldable display apparatus further includes: a first accommodation portion defined beneath the first support and a second accommodation portion defined beneath the bellows; and a driver of the light-emitting element disposed in at least one of the first accommodation portion and the second accommodation portion.

In one implementation of the first aspect, a panel through-hole for sliding the display panel, the cover window, and the bottom plate is defined in one face of the edge.

In one implementation of the first aspect, the panel through-hole is defined in each of at least two faces of the edge.

In one implementation of the first aspect, a hinge is disposed on the other face of the display apparatus where the first support and the bellows are coupled to each other.

A second aspect of the present disclosure provides a foldable display apparatus including a bottom plate, a display panel, and a cover window sequentially disposed, the foldable display apparatus comprising: a bellows for supporting at least a portion of the bottom plate; a first support for supporting another portion of the bottom plate; and an edge disposed at one end of the bottom plate.

In one implementation of the second aspect, a panel through-hole for sliding the display panel, the cover window, and the bottom plate is defined in one face of the edge.

In one implementation of the second aspect, the panel through-hole is defined in each of at least two faces of the edge.

In one implementation of the second aspect, the foldable display apparatus further includes: a second support disposed between the first support and the edge.

In one implementation of the second aspect, the foldable display apparatus further includes: an LM guide disposed inwardly of the second support; and a guide fastening portion movable with respect to the LM guide.

In one implementation of the second aspect, the foldable display apparatus further includes: a bellows guide bar disposed inside the bellows and coupled to the guide fastening portion.

In one implementation of the second aspect, the foldable display apparatus further includes: a first accommodation portion defined beneath the first support and a second accommodation portion defined beneath the bellows; and a driver of a light-emitting element disposed in at least one of the first accommodation portion and the second accommodation portion.

Features, structures, effects, and the like described in the examples of the present application described above are included in at least one example of the present application, and are not necessarily limited to only one example. Furthermore, features, structures, effects, and the like illustrated in at least one example of the present application may be combined or modified with respect to other examples by those of ordinary skill in the art to which the present application belongs. Accordingly, the contents related to such combinations and modifications should be interpreted as being included in the scope of the present application.

The present disclosure as described above is not limited to the above-described embodiments and the accompanying drawings. It will be apparent to those of ordinary skill in the technical field to which the present disclosure belongs that various substitutions, modifications and changes may be made within the scope not departing from the technical ideas of the present disclosure. Therefore, the scope of the present disclosure is indicated by the following claims, and all changes or modifications derived from the meaning and scope of the claims and their equivalent concepts should be construed as being included in the scope of the present disclosure.

What is claimed is:

1. A foldable display apparatus comprising:
    a display panel;
    a cover window disposed over the display panel;
    a bottom plate disposed beneath the display panel;
    a bellows for supporting at least a portion of the bottom plate;
    a first support coupled with a first end of the bellows; and
    an edge coupled with a second end of the bellows,
    wherein a panel through-hole for sliding the display panel, the cover window, and the bottom plate therethrough is defined in one face of the edge.

2. The foldable display apparatus of claim 1, wherein the display panel has a light-emitting element disposed thereon.

3. The foldable display apparatus of claim 1, wherein the bellows has a characteristic capable of being compressed or tensioned by an external force and maintaining its state.

4. The foldable display apparatus of claim 1, wherein the bellows is disposed on each of a front face with a display area and a rear face.

5. The foldable display apparatus of claim 1, wherein the edge repeats moving closer to and further from the first support when a display area of the display panel is reduced and expanded.

6. The foldable display apparatus of claim 1, further comprising:
    a second support disposed between the first support and the edge.

7. The foldable display apparatus of claim 6, further comprising:
    an LM (linear motor) guide disposed inwardly of the second support; and
    a guide fastening portion movable with respect to the LM guide.

8. The foldable display apparatus of claim 7, further comprising:
    a bellows guide bar disposed inside the bellows and coupled to the guide fastening portion.

9. The foldable display apparatus of claim 8, wherein when the guide fastening portion moves along a driving shaft of the LM guide, the bellows guide bar coupled to the guide fastening portion moves along the driving shaft of the LM guide.

10. The foldable display apparatus of claim 8, wherein the LM guide is placed on an inner face of the second support, and the LM guide and the guide fastening portion are coupled to each other for driving.

11. The foldable display apparatus of claim 1, further comprising:
- a first accommodation portion defined beneath the first support and a second accommodation portion defined beneath the bellows; and
- a driver of the display panel disposed in at least one of the first accommodation portion and the second accommodation portion.

12. The foldable display apparatus of claim 1, wherein the panel through-hole is defined in each of at least two faces of the edge.

13. The foldable display apparatus of claim 1, wherein a hinge is disposed on a face of the display apparatus where the first support and the bellows are coupled to each other.

14. A foldable display apparatus including a bottom plate, a display panel, and a cover window sequentially disposed, the foldable display apparatus comprising:
- a bellows for supporting at least a portion of the bottom plate;
- a first support for supporting another portion of the bottom plate; and
- an edge disposed at one end of the bottom plate,
- wherein a first end of the bellows is coupled to the first support and a second end of the bellows is coupled to the edge, and
- wherein a panel through-hole for sliding the display panel, the cover window, and the bottom plate therethrough is defined in one face of the edge.

15. The foldable display apparatus of claim 14, wherein the panel through-hole is defined in each of at least two faces of the edge.

16. The foldable display apparatus of claim 14, further comprising:
- a second support disposed between the first support and the edge.

17. The foldable display apparatus of claim 16, further comprising:
- an LM guide disposed inwardly of the second support; and
- a guide fastening portion movable with respect to the LM guide.

18. The foldable display apparatus of claim 17, further comprising:
- a bellows guide bar disposed inside the bellows and coupled to the guide fastening portion.

19. The foldable display apparatus of claim 14, further comprising:
- a first accommodation portion defined beneath the first support and a second accommodation portion defined beneath the bellows; and
- a driver of the display panel disposed in at least one of the first accommodation portion and the second accommodation portion.

* * * * *